(12) United States Patent
Park et al.

(10) Patent No.: US 8,921,506 B2
(45) Date of Patent: *Dec. 30, 2014

(54) COPOLYMER, ORGANIC SOLAR CELL USING THE SAME AND MANUFACTURING METHOD THEREOF

(75) Inventors: Taiho Park, Pohang-si (KR); Gang-Young Lee, Pohang-si (KR); Minjeong Im, Chungju-si (KR); Seulki Song, Seoul (KR); Jinseck Kim, Daejeon (KR); Jaechol Lee, Daejeon (KR); Hangken Lee, Daejeon (KR); Songrim Jang, Daejeon (KR); Keun Cho, Jeonju-si (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/566,818

(22) Filed: Aug. 3, 2012

(65) Prior Publication Data

US 2013/0056072 A1 Mar. 7, 2013

(30) Foreign Application Priority Data

Aug. 3, 2011 (KR) ........................ 10-2011-0077495

(51) Int. Cl.
*C08G 14/10* (2006.01)
*H01L 51/00* (2006.01)
*C08G 61/12* (2006.01)
*H01L 51/42* (2006.01)

(52) U.S. Cl.
CPC ............ *H01L 51/0043* (2013.01); *Y02E 10/52* (2013.01); *C08G 2261/3246* (2013.01);

(Continued)

(58) Field of Classification Search
USPC ......... 136/263; 438/82; 528/7, 373, 377, 380; 257/E51.026
See application file for complete search history.

(56) References Cited

U.S. PATENT DOCUMENTS

| 2003/0008172 A1 | 1/2003 | Leclerc et al. |
| 2011/0251370 A1 | 10/2011 | Beaujuge et al. |

(Continued)

FOREIGN PATENT DOCUMENTS

| CN | 101875716 A | 11/2010 |
| CN | 102405247 A | 4/2012 |

(Continued)

OTHER PUBLICATIONS

Fu et al. (Journal of Polymer Science Part A: Polymer Chemistry 2011, 49, 4368-4378).*

(Continued)

*Primary Examiner* — Shane Fang
(74) *Attorney, Agent, or Firm* — McKenna Long & Aldridge LLP (57) ABSTRACT

A copolymer includes a first unit and at least two units different from the first unit. An organic solar cell includes a first electrode, a second electrode opposite the first electrode, and one or more organic material layers interposed between the first electrode and the second electrode and including a photoactive layer, and one or more of the organic material layers include the copolymer. A method for fabricating an organic solar cell includes preparing a substrate, forming a first electrode on a region of rear sides of the substrate, forming on the first electrode an organic material layer containing the copolymer, and forming a second electrode on the organic material layer.

22 Claims, 1 Drawing Sheet

(52) U.S. Cl.
CPC .. *H01L 2251/308* (2013.01); *C08G 2261/3241* (2013.01); *H01L 51/0036* (2013.01); *C08G 61/124* (2013.01); *C08G 2261/124* (2013.01); *H01L 51/4253* (2013.01); *Y02E 10/549* (2013.01); *C08G 2261/3223* (2013.01); *H01L 51/0037* (2013.01); *C08G 2261/91* (2013.01); *C08G 61/126* (2013.01); *C08G 2261/411* (2013.01); *C08G 61/123* (2013.01)
USPC ............... 528/163; 528/7; 528/377; 528/380; 528/373; 136/263; 257/E51.026

(56) References Cited

U.S. PATENT DOCUMENTS

| | | | |
|---|---|---|---|
| 2012/0018715 A1 | 1/2012 | Moon et al. | |
| 2013/0032209 A1 | 2/2013 | Kim et al. | |
| 2013/0056072 A1 | 3/2013 | Park et al. | |

FOREIGN PATENT DOCUMENTS

| | | |
|---|---|---|
| JP | 2008-174661 A | 7/2008 |
| JP | 2014-185192 A | 10/2014 |
| JP | 2014-185193 A | 10/2014 |
| KR | 10-0575382 B1 | 4/2006 |
| KR | 10-2010-0037403 A | 4/2010 |
| KR | 10-2010-0111767 A | 10/2010 |
| KR | 10-2011-0072529 A | 6/2011 |
| KR | 10-1102079 B1 | 6/2011 |
| WO | 99/54385 A1 | 10/1999 |
| WO | 2010/062948 A2 | 6/2010 |
| WO | 2010/117158 A2 | 10/2010 |

OTHER PUBLICATIONS

Lai, Mei-Hsiu et al.; "Syntheses of New 3, 6-Carbazole-Based Donor/Acceptor Conjugated Copolymers for Optoelectronic Device Applications." Macromolecular Chemistry and Physics; 2010, vol. 211. p. 2017-2025.

Fu, Yuanhe et al.; "Parameters Influencing the Molecular Weight of 3,6-Carbazole-Based D-π-A-Type Copolymers." Jul. 2011; Journal of Polymer Science Part A: Polymer Chemistry. vol. 49, p. 4368-4378.

Yuanhe Fu, et al., Parameters Influencing the Molecular Weight of 3,6-Carbazole-Based D-π-A-Type Copolymers, Journal of Polymer Chemistry, Oct. 2011, vol. 49, Issue 20, p. 4368-4378.

Yuanhe Fu, et al., Parameters Influencing the Molecular Weight of 3,6-Carbazole-Based D-pi-A-Type Copolymers, Polymer Chemistry, vol. 49, pp. 4368-4378, dated Jul. 28, 2011.

Mei-Hsiu Lai, et al., Syntheses of New 3,6-Carbazole-Based Donor/Acceptor Conjugated Copolymers for Optoelectronic device Applications, Macromolecular Chemistry and Physics, pp. 2017-2025, 2010.

Macromolecules 2012, 45, 3004-3009.

Advanced Materials Research Vols. 197-198 (2011) pp. 1221-1224.

Rong Guan, et al.: Amino-containing saturated red light-emitting copolymers based on fluorene and carbazole units, Science Direct, Dyes and Pigments, 2008, pp. 165-172.

Jian Huang, et al.: "Novel Red Electroluminescent Polymers Derived from Carbazole and 4,7-Bis(2-thienyl)-2, 1,3-benzo-thiadiazole", Macromol., Rapid Commun., 2002, 23, pp. 709-712.

Ruiping Qin, et al.: "A Planar Copolymer for High Efficiency Polymer Solar Cells", J. Am. Chem. Soc., 2009, 131, pp. 14612-14613.

* cited by examiner

COPOLYMER, ORGANIC SOLAR CELL USING THE SAME AND MANUFACTURING METHOD THEREOF

This application claims priority to and the benefit of Korean Patent Application No. 10-2011-0077495, filed on Aug. 3, 2011, which is hereby incorporated by reference in its entirety herein.

BACKGROUND OF THE INVENTION

1. Field of the Invention

The present disclosure relates to a novel copolymer, an organic solar cell comprising the same and a method for fabricating the organic solar cell.

2. Description of the Prior Art

Since the possibility of solar cells based on organic copolymers was first shown by Heeger at the University of California, Santa Barbara (UCSB), in 1992, there have been many studies thereon. Such solar cells include heterojunction thin film devices comprising a mixture of an organic copolymer, which absorbs light, with a C60 or C70 fullerene derivative which has a very high electron affinity. These heterojunction thin film devices comprise a transparent positive electrode made of indium tin oxide (ITO) and a negative electrode made of a metal such as Al, which has a low work function.

In such solar cells, the photoactive layer comprising the organic copolymer absorbs light to form electron-hole pairs or excitons. The electron-hole pairs move to the interface between the copolymer and the C60 or C70 fullerene derivative at which they are separated into electrons and holes. Then, the electrons move to the metal electrode, and the holes move to the transparent electrode, thereby generating electrodes.

Currently, the efficiency of organic copolymer thin-film solar cells based on organic copolymers reaches 7-8% (Nature Photonics, 2009, 3, 649-653).

However, the efficiency of the organic copolymer solar cell is still low compared to the maximum efficiency of solar cells based on silicon (about 39%). Thus, the development of organic polymer solar cells having a higher efficiency is required.

Korean Patent Laid-Open Publication No. 10-2010-0111767 discloses a conductive copolymer comprising 2,7-carbazole in the main chain, and an organic solar cell comprising the same. According to the disclosure of the above patent publication, the conductive copolymer comprising 2,7-carbazole in the main chain improves light absorption and hole mobility to improve the efficiency of the solar cell.

However, there is a problem in that it is not easy to improve optical efficiency, because the mobility of holes is relatively lower than the mobility of electrons, despite the use of 2,7-carbazole.

PRIOR ART DOCUMENTS

Patent Documents

Korean Patent Laid-Open Publication No. 10-2010-0111767

Non-Patent Documents

Macromolecules 2011, 44(7), 1909-1919
Nature Photonics, 2009, 3, 649-653
B. Nicolas, M. Alexandre, M. Leclerc, Adv. Mater. 19, 2295-2300
Y. Human, A. Solyman, I. Ahmed, W. C. Darren, K. James, L. G. David, J. Mater. Chem. 21, 13649-13656

SUMMARY OF THE INVENTION

It is an object of the present disclosure to provide an organic semiconductor material, which can exhibit excellent electrical properties thanks to high hole mobility and has high photovoltaic conversion efficiency resulting from increased solubility attributable to a specific substituent introduced into the side chain, and an organic solar cell comprising the same.

To achieve the above object, the present disclosure provides a copolymer comprising a first unit represented by the formula 1 and at least one unit different from the first unit, wherein the first unit is present in an amount of greater than 0 mole % and 45 mole % or less based on the total moles of monomers constituting the copolymer, and the copolymer has, in its side chain, at least one selected from the group consisting of a substituted or unsubstituted alkyl group having 1 to 40 carbon atoms, a substituted or unsubstituted alkoxy group having 1 to 40 carbon atoms, a substituted or unsubstituted sulfide group having 1 to 40 carbon atoms, and a hydroxyl group:

[Formula 1]

wherein o and p are each an integer ranging from 0 to 3;

$R_a$ and $R_b$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_a$ and $R_b$ may form a condensed ring; and $R_1$ is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S.

The present disclosure also provides a copolymer comprising a first unit represented by the following formula 1, a second unit represented by the following formula 3 and a third unit represented by the following formula 4:

[Formula 1]

[Formula 3]

[Formula 4]

wherein o, p, q and r are each an integer ranging from 0 to 3;

s and t are each an integer ranging from 0 to 4;

$R_1$ and R" are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S;

$R_a$, $R_b$, $R_6$ and $R_7$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_a$, $R_b$, $R_6$ and $R_7$ may form a condensed ring;

$R_8$ to $R_{13}$ are the same or different and are each independently selected from the group consisting of hydrogen, a hydroxyl group, a substituted or unsubstituted alkyl group having 1 to 40 carbon atoms, a substituted or unsubstituted alkoxy group having 1 to 40 carbon atoms, and a substituted or unsubstituted sulfide group having 1 to 40 carbon atoms, or adjacent two of $R_8$ to $R_{13}$ may form a condensed ring; and at least one of $R_8$ to $R_{13}$ is selected from the group consisting of a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms.

The present disclosure also provides a copolymer comprising the first unit of formula 1 and at least one unit different from the first unit, wherein the first unit is present in an amount of greater than 0 mole % and 45 mole % or less based on the total moles of monomers constituting the copolymer, and a substituent which increases solubility is bound to the side chain of the copolymer.

The present disclosure also provides a copolymer comprising the first unit of formula 1 and at least one unit different from the first unit, wherein the first unit is present in an amount of greater than 0 mole % and 45 mole % or less based on the total moles of monomers constituting the copolymer, and the copolymer has a solubility of 100 mg/ml or more in a 1,2-dichlorobenzene (DCB) solvent.

The present disclosure also provides an organic solar cell comprising: a first electrode; a second electrode opposite the first electrode; one or more organic material layers interposed between the first and second electrodes and including a photoactive layer, wherein one or more of the organic material layers comprise the copolymer comprising the first unit of formula 1.

The present disclosure also provides a method for fabricating an organic solar cell, the method comprising the steps of: preparing a substrate; forming a first electrode on a region of rear sides of the substrate; forming on the first electrode an organic material layer comprising the copolymer including the first unit of formula 1; and forming a second electrode on the organic material layer.

DETAILED DESCRIPTION OF THE INVENTION

Hereinafter, the present disclosure will be described in detail.

The present disclosure provides a copolymer comprising a first unit represented by the above formula 1 and at least one unit different from the first unit.

As used herein, the term "unit" means the polymerized form of a repeating monomer unit in the copolymer.

The first unit of formula 1 contains a substituted or unsubstituted 3,6-carbazole group. An organic solar cell comprising the copolymer including the first unit has high charge mobility compared to an organic solar cell comprising a 2,7-carbazole-containing copolymer, and the first unit of formula 1 contributes to the stability of the copolymer.

Figure 1:
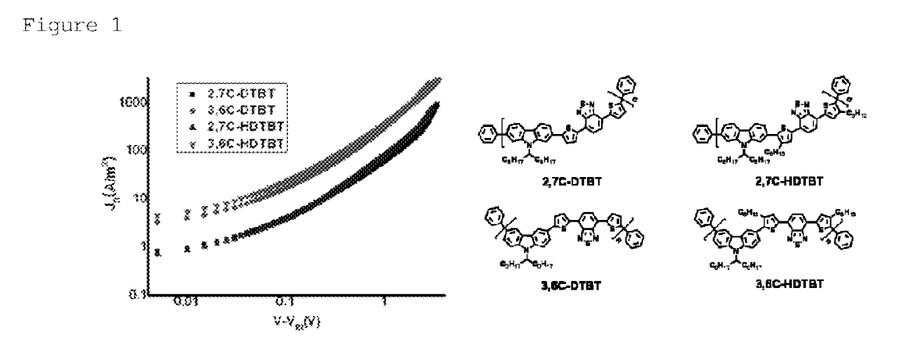
FIG. 1 is a graphic diagram showing a comparison of charge mobility between 3,6-carbazole-containing copolymers and 2,7-carbazole-containing copolymers.
Figure 2:
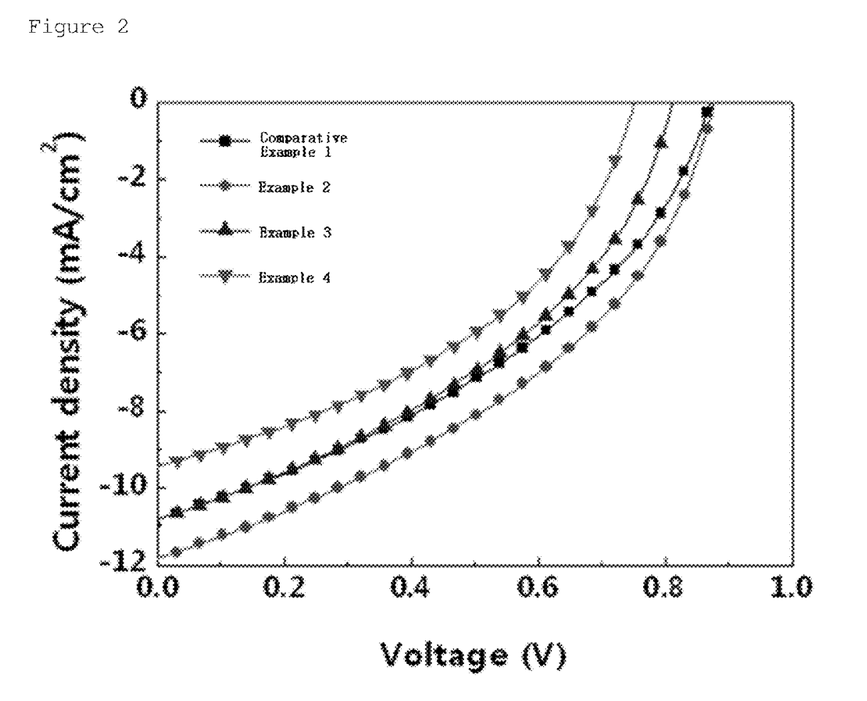
FIG. 2 is a graphic diagram showing current-voltage curves for organic solar cells of Examples 2 to 4 and Comparative Example 1.

FIG. 1 is a graphic diagram showing a comparison of charge mobility between 3,6-carbazole-containing copolymers and 2,7-carbazole-containing copolymers.

In one embodiment of the present disclosure, the first unit of formula 1 in the copolymer is preferably present in an amount of greater than 0 mole % and 45 mole % or less based on the total moles of monomers constituting the copolymer.

In another embodiment, the content of the first unit of formula 1 is 0.1-30 mole % based on the total moles of the monomers. In still another embodiment, the content of the first unit of formula 1 is 0.5-20 mole % based on the total moles of the monomers. In yet another embodiment, the content of the first unit of formula 1 is 0.5-15 mole % based on the total moles of the monomers. In another further embodiment, the content of the first unit of formula 1 is 1-10 mole % based on the total moles of the monomers.

In the 3,6-carbazole-containing copolymer, a nitrogen atom is conjugated to the main chain to stabilize holes and increase the mobilities of holes and electrons, so that hole mobility and electron mobility in the organic solar cell comprising the copolymer can be balanced. Thus, the present disclosure provides an organic semiconductor material, which can exhibit excellent electrical properties thanks to the balance between hole mobility and electron mobility and has high photovoltaic conversion efficiency, and an organic solar cell comprising the same.

Conventional 2,7-carbazole-containing copolymers do not appear to exhibit excellent electrical properties, because no nitrogen atom is not conjugated to the main chain.

In contrast, if the content of the first unit of formula 1 in the copolymer comprising the first unit of formula 1 is 45 mole % or less based on the total moles of monomers constituting the copolymer, a reduction in the optical absorption of the copolymer, which results from the relatively low absorbance of the carbazole group, can be minimized. In addition, in this case, a copolymer having a suitable molecular weight can be prepared.

The present disclosure also provides a copolymer as described above, which has at least one selected from the group consisting of a substituted or unsubstituted alkyl group having 1 to 40 carbon atoms, a substituted or unsubstituted alkoxy group having 1 to 40 carbon atoms, a substituted or unsubstituted sulfide group having 1 to 40 carbon atoms, and a hydroxyl group.

Conventional copolymers disadvantageously have low solubility in organic solvents, and thus phase separation occurs when the conventional copolymer is mixed with an electron acceptor to make a solution. In addition, due to the low solubility of the conventional copolymer, a process for dissolving the copolymer is time consuming, and an organic layer film formed using the copolymer is non-uniform.

According to the present disclosure, introduction of an alkyl group, a sulfide group, an alkoxy group or a hydroxyl group into the side chain of the copolymer can increase the solubility of the copolymer.

When a copolymer having increased solubility is used, it can be highly miscible with an electron acceptor, so that the contact interface with the electron acceptor can be increased. In addition, the time required for dissolving the copolymer can be reduced and an organic layer film formed using the copolymer can become uniform.

Specifically, if the above-described alkyl, sulfide or alkoxy group has 40 or less carbon atoms, it can increase the solubility of the copolymer without reducing the mobilities of electrons and holes and the efficiency of the organic solar cell comprising the copolymer.

In one embodiment of the present disclosure, the unit different from the first unit in the copolymer includes at least one electron acceptor.

In one embodiment of the present disclosure, the electron acceptor is present in an amount of greater than 0 mole % and 50 mole % or less based on the total moles of monomers constituting the copolymer.

In another embodiment of the present disclosure, the unit different from the first unit in the copolymer includes at least one electron acceptor and at least one electron donor.

In still another embodiment of the present disclosure, the unit different from the first unit in the copolymer includes at least two electron acceptors and at least one electron donor.

Examples of the substituents of the above formulas will be described below, but are not limited thereto.

In the present disclosure, the alkyl group may be a straight or branched-chain alkyl group, and the number of carbon atoms thereof is preferably 1 to 400, but is not limited thereto. Specific examples of the alkyl group include, but are not limited to, methyl, ethyl, propyl, isopropyl, butyl, t-butyl, pentyl, hexyl and heptyl groups.

In the present disclosure, the alkenyl group may be a straight or branched-chain alkenyl group, and the number of carbon atoms thereof is preferably 2 to 40, but is not limited thereto. Specific examples of the alkenyl group include, but are not limited to, aryl-substituted alkenyl groups, such as stylbenzyl and styrenyl groups.

In the present disclosure, the alkoxy group may be a straight, branched or cyclic chain alkoxy group. The number of carbon atoms of the alkoxy group is preferably 1 to 40, but is not limited thereto. Specific examples of the alkoxy group include, but are not limited to, methoxy, ethoxy, n-propyloxy, iso-propyloxy, n-butyloxy and cyclopentyloxy groups.

In the present disclosure, the cycloalkyl group preferably contains 3 to 60 carbon atoms, but is not limited thereto. Particularly preferred examples of the cycloalkyl group include cyclopentyl and cyclohexyl groups.

In the present disclosure, the halogen group may be fluorine, chlorine, bromine or iodine.

In the present disclosure, the aryl group may be monocyclic, and the number of carbon atoms thereof is preferably 6 to 60, but is not limited thereto. Specific examples of the aryl group include, but are not limited to, monocyclic aromatic groups, such as phenyl, biphenyl, triphenyl, terphenyl or stilbene groups, and polycyclic aromatic groups, such as naphthyl, anthracenyl, phenanthrenyl, pyrenyl, perylenyl, tetracenyl, chrysenyl, fluorenyl, acenaphthacenyl, triphenylene or fluoranthene groups.

In the present disclosure, the heterocyclic group is a heterocyclic group containing at least one heteroatom selected from among O, N and S, and the number of carbon atoms thereof is preferably 2 to 60, but is not limited thereto. Examples of the heterocyclic group include, but are not limited to, thiophene, furan, pyrrol, imidazole, thiazole, oxazole, oxadiazole, triazole, pyridyl, bipyridyl, triazine, acridyl, pyridazine, quinolinyl, isoquinolinyl, indole, carbazole, benzoxazole, benzothiazole, benzimidazole, benzocarbazole, benzothiophene, dibenzothiophene, benzofuranyl, phenanthroline and dibenzofuranyl groups.

In the present disclosure, the imide group preferably contains 1 to 25 carbon atoms, but is not limited thereto. Specific examples of the imide group include, but are not limited to, compounds having the following formulas:

In the present disclosure, the amide group is an amide group whose nitrogen may be mono- or di-substituted with hydrogen, a straight, branched or cyclic chain alkyl group having 1 to 25 carbon atoms or an aryl group having 6 to 25 carbon atoms. Specific examples of the amide group include, but are not limited to, compounds having the following formulas:

In the present disclosure, the ester group is an ester group whose oxygen may be substituted with a straight, branched or cyclic chain alkyl group having 1 to 25 carbon atoms or an aryl group having 6 to 25 carbon atoms. Specific examples of the ester group include, but are not limited to, compounds having the following formulas:

In the present disclosure, the heteroaryl group may be selected from among the above-described examples of the heterocyclic group.

In the present disclosure, the fluorenyl group has a structure in which two cyclic organic compounds are linked to each other by one atom, and examples thereof include and the like.

In the present disclosure, the fluorenyl groups include an open fluorenyl group having a structure in which one of two cyclic compounds linked to each other by one atom is broken. Examples of the open fluorenyl group include and the like.

In the present disclosure, the amine group preferably contains 1 to 30 carbon atoms, but is not limited thereto. Specific examples of the amine group include, but are not limited to, methylamine, dimethylamine, ethylamine, diethylamine, phenylamine, naphthylamine, biphenylamine, anthracenylamine, 9-methyl-anthracenylamine, diphenylamine, phenylnaphthylamine, ditolylamine, phenyltolylamine and triphenylamine groups.

In the present disclosure, examples of the arylamine group include substituted or unsubstituted monocyclic diarylamine, substituted or unsubstituted polycyclic diarylamine, and substituted or unsubstituted monocyclic or polycyclic diarylamine groups.

In the present disclosure, the aryl group of the aryloxy, arylthioxy, arylsulfoxy and aralkylamine groups is as defined above for the aryl group.

In the present disclosure, the alkyl group of the alkylthioxy, alkylsulfoxy, alkylamine and aralkylamine groups is as defined above for the alkyl group.

In the present disclosure, the heteroaryl group of the heteroarylamine group may be selected from among the above-described examples of the heterocyclic group.

In the present disclosure, the arylene, alkenylene, fluorenylene, carbazolylene and heteroarylene groups are divalent aryl, alkenyl, fluorenyl and carbazole groups, respectively. These groups are as defined above for the aryl, alkenyl, fluorenyl and carbazole groups, except that they are divalent groups.

In the present disclosure, the sulfide group preferably 1 to 40 carbon atoms, but is not limited thereto. Specific examples of the sulfide group include, but are not limited to, dimethyl sulfide, dimethyl trisulfide, dimethyl tetrasulfide, etc.

As used herein, the term "substituted or unsubstituted" means that it is unsubstituted or substituted with one or more selected from the group consisting of deuterium, a halogen group, an alkyl group, an alkenyl group, an alkoxy group, a cycloalkyl group, a silyl group, an arylalkenyl group, an aryl group, an aryloxy group, an alkylthioxy group, an alkylsulfoxy group, an arylsulfoxy group, a boron group, an alkylamine group, an aralkylamine group, an arylamine group, a heteroaryl group, a carbazole group, an arylamine group, an aryl group, a fluorenyl group, a nitrile group, a nitro group, a hydroxyl group, and a heterocyclic group containing at least one heteroatom selected from among N, O and S.

In the present disclosure, the electron acceptor and the electron donor may be any conventional electron acceptor and electron donor known in the field of organic solar cells. Specifically, the electron acceptor is a carbon-based aromatic compound or a heteroaromatic compound containing at least one heteroatom selected from among sulfur, phosphorus, nitrogen, selenium and the like.

In one embodiment of the present disclosure, the copolymer is represented by the following formula 2:

[Formula 2]

wherein l is a mole fraction in the range of 0<l≤1;

m is a mole fraction in the range of 0≤m<1;

l+m=1;

n is an integer ranging from 1 to 10,000;

A is represented by the above formula 1;

B, C and D are the same or different and are each independently an electron acceptor or an electron donor; and at least one of B, C and D is an electron acceptor.

In one embodiment of the present disclosure, B in formula 2 is an electron acceptor.

In another embodiment, D in formula 2 is an electron acceptor.

In still another embodiment, B and D in formula 4 are each an electron acceptor.

In one embodiment of the present disclosure, the electron acceptor in the copolymer is represented by the following formula 3:

[Formula 3]

wherein s and t are each an integer ranging from 0 to 4; and $R_8$ to $R_{13}$ are the same or different and are each independently selected from the group consisting of hydrogen, a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms, or adjacent two of $R_8$ to $R_{13}$ may form a condensed ring.

Preferably, at least one of $R_8$ to $R_{13}$ in formula 3 is a hydroxyl group, a substituted or unsubstituted alkyl group having 1 to 40 carbon atoms, a substituted or unsubstituted sulfide group having 1 to 40 carbon atoms, or a substituted or unsubstituted alkoxy group having 1 to 40 carbon atoms, which can increase the solubility of the copolymer.

In one embodiment of the present disclosure, at least one of $R_8$ to $R_{13}$ in formula 3 is selected from the group consisting of a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms.

In another embodiment of the present disclosure, at least two of $R_8$ to $R_{13}$ in formula 3 are selected from the group consisting of a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms.

In another embodiment of the present disclosure, at least one of $R_{10}$ and $R_{11}$ in formula 3 is selected from the group consisting of a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms.

In another embodiment of the present disclosure, $R_{10}$ and $R_{11}$ are the same or different and are each independently a substituted or unsubstituted alkyl group having 1 to 40 carbon atoms, a substituted or unsubstituted sulfide group having 1 to 40 carbon atoms, or a substituted or unsubstituted alkoxy group having 1 to 40 carbon atoms.

In another embodiment of the present disclosure, $R_{10}$ and $R_{11}$ are the same or different and are each independently a substituted or unsubstituted alkoxy group having 1 to 40 carbon atoms.

In one embodiment of the present disclosure, the electron donor in the copolymer is represented by the following formula 4:

[Formula 4]

wherein q and r are each an integer ranging from 0 to 3;

$R_6$ and $R_7$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_6$ and $R_7$ may form a condensed ring; and R" is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S.

The copolymer of the present disclosure comprises a 2,7-carbazole unit in addition to a 3,6-carbazole unit. This 2,7-carbazole unit provides low band gap energy and is highly stable against chemical and thermal attacks, air and moisture compared to other electron donors, so that it improves the efficiency of the organic solar cell comprising the copolymer.

In one embodiment of the disclosure, the unit of formula 4 in the copolymer is present in an amount of more than 0 mole % and 40 mole % or less based on the total moles of monomers constituting the copolymer.

In another aspect, the present disclosure provides a copolymer comprising the first unit of formula 1, the second unit of formula 3 and the third unit of formula 4.

In one embodiment of the disclosure, the second unit of formula 3 in the copolymer is present in an amount of greater than 0 mole % and 50 mole % or less based on the total moles of monomers constituting the copolymer.

In one embodiment, the present disclosure provides a copolymer comprising the first unit of formula 1, the second unit of formula 3 and the third unit of formula 4, wherein the first unit of formula 1 is present in an amount of greater than 0 mole % and 10 mole % or less based on the total moles of monomers constituting the copolymer, the second unit of formula 3 is present in an amount of greater than 0 mole % and 50 mole % or less based on the total moles of the monomers, and the third unit of formula 4 is present in an amount of more than 0 mole % and 40 mole % or less based on the total moles of the monomers.

In another aspect, the present disclosure provides a copolymer comprising the first unit of formula 1 and at least one unit different from the first unit, wherein the first unit is present in an amount of greater than 0 mole % and 45 mole % or less based on the total moles of monomers constituting the copolymer, and at least one substituent which increases solubility is bound to the side chain of the copolymer.

As the substituent that is bound to the side chain of the copolymer, any substituent may be used as long as it increases the solubility of the copolymer. Preferred examples of this substituent include a straight or branched chain alkyl group having 1 to 40 carbon atoms, a straight or branched chain alkoxy group having 1 to 40 carbon atoms, a hydroxyl group, and a sulfide group having 1 to 40 carbon atoms.

Preferably, the side chain of the copolymer has a substituent which enables the copolymer to have a solubility of 100 mg/ml or more in a 1,2-dichlorobenzene (DCB) solvent.

In one embodiment of the present disclosure, the unit different from the first unit in the copolymer includes at least one electron acceptor.

In another embodiment of the present disclosure, the unit different from the first unit in the copolymer includes at least one electron acceptor and at least one electron donor.

In one embodiment of the present disclosure, $R_a$ in formula 3 is hydrogen.

In another embodiment, $R_b$ is hydrogen.

In still another embodiment, s and t in formula 3 is each 1.

In still another embodiment, $R_8$ is hydrogen.

In still another embodiment, $R_9$ is hydrogen.

In still another embodiment, $R_{12}$ is hydrogen.

In still another embodiment, $R_{13}$ is hydrogen.

In still another embodiment, $R_6$ in formula 4 is hydrogen.

In still another embodiment, $R_7$ in formula 4 is hydrogen.

In one embodiment of the present disclosure, the copolymer further comprises a fourth unit represented by the following formula 5 and a fifth unit represented by the following formula 6:

[Formula 5]

-continued

[Formula 6]

wherein
R$_1$ is as defined in formula 1;
l is a mole fraction in the range of 0<l≤1;
m is a mole fraction in the range of 0≤m<1;
l+m=1;
R" is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S; and
R$_{10}$ and R$_{11}$ are the same or different and are each independently selected from the group consisting of a hydroxyl group, a substituted or unsubstituted alkyl group having 1 to 40 carbon atoms, a substituted or unsubstituted sulfide group having 1 to 40 carbon atoms, and a substituted or unsubstituted alkoxy group having 1 to 40 carbon atoms.

The present disclosure also provides a copolymer comprising a first unit represented by the above formula 1 and at least one unit different from the first unit, wherein the first unit is present in an amount of greater than 0 mole % and 45 mole % or less based on the total moles of monomers constituting the copolymer, and the copolymer has a solubility of 100 mg/ml or more in a 1,2-dichlorobenzene (DCB) solvent.

In one embodiment of the present disclosure, the unit different from the first unit in the copolymer includes at least one electron acceptor.

In another embodiment of the present disclosure, the unit different from the first unit in the copolymer includes at least one electron acceptor and at least one electron donor.

In one embodiment of the present disclosure, the end group of the copolymer is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S.

In another embodiment of the present disclosure, the end group of the copolymer is an aryl group.

In one embodiment of the present disclosure, the end group of the copolymer is a heterocyclic group.

In one embodiment of the present disclosure, the copolymer preferably has a number-average molecular weight of 500-1,000,000 g/mol, and more preferably 10,000-100,000 g/mol.

In one embodiment of the present disclosure, the copolymer may have a molecular weight distribution of 1-100. Preferably, the copolymer has a molecular weight distribution of 1-3.

As the molecular weight distribution decreases and the number-average molecular weight increases, the electrical and mechanical properties of the copolymer become better.

In addition, in order for the copolymer to have a specific level or higher of solubility so that a solution application method is advantageously applied, the copolymer preferably has a number-average molecular weight of 100,000 or less. The copolymer comprising the unit of formula 1 can be prepared based on Preparation Examples as described below.

The copolymer according to the present disclosure can be prepared by a multi-step chemical reaction. Specifically, monomers can be prepared by an alkylation reaction, the Grignard reaction, the Suzuki coupling reaction and the Stille coupling reaction, after final polymers can be prepared from the monomers by a carbon-carbon coupling reaction such as the Stille coupling reaction. When the substituent to be introduced is a boronic acid or boronic ester compound, the copolymer can be prepared by the Suzuki coupling reaction, and when the substituent to be introduced is a tributyltin compound, the copolymer can be prepared by the Stille coupling reaction, but is not limited thereto.

In another aspect, the present disclosure provides an organic solar cell comprising the copolymer containing the unit of formula 1.

Specifically, the present disclosure provides an organic solar cell comprising: a first electrode; a second electrode opposite the first electrode; and one or more organic material layers interposed between the first electrode and the second electrode and including a photoactive layer, wherein one or more of the organic material layers comprise the above-described copolymer.

In one embodiment of the present disclosure, the organic solar cell comprises the first electrode, the photoactive layer and the second electrode. The organic solar cell may further comprise a substrate, a hole transport layer and/or an electron transport layer.

The substrate may be a glass or transparent substrate having excellent transparency, surface smoothness, ease of handling, and water resistance, but is not limited thereto. The substrate is not limited as long as it is commonly used in organic solar cells. Specific examples of the substrate include, but are not limited to, polyethylene terephthalate (PET), polyethylene naphthalate (PEN), polypropylene (PP), polyimide (PI) and triacetyl cellulose (TAC).

The first electrode may be made of a transparent, highly conductive material, but is not limited thereto. Specific examples of the material of the first electrode include, but are not limited to, indium tin oxide (ITO), tin oxide ($SnO_2$) and zinc oxide (ZnO).

The second electrode may be made of a metal having a low work function, but is not limited thereto. Specific examples of the material of the second electrode include, but are not limited to, metals, such as lithium, magnesium or aluminum, alloys thereof, and multilayer materials, such as Al:Li, Al:$BaF_2$, or Al:$BaF_2$:Ba.

The hole transport layer and/or the electron transport layer may be made of a material which efficiently transfers electrons and holes to the photoactive layer to increase the mobility of produced charges to the electrodes, but is not limited thereto.

Examples of the material of the hole transport layer include PEDOT:PSS (poly(3,4-ethylenediocythiophene) doped with poly(styrenesulfonic acid)), and N,N'-bis(3-methylphenyl)-N,N'-diphenyl-[1,1'-biphenyl]-4,4'-diamine (TPD). Examples of the material of the electron transport layer include aluminum trihydroxyquinoline ($Alq_3$), the 1,3,4-oxadiazole derivative PBD (2-(4-biphenyl)-5-phenyl-1,3,4-oxadiazole), the quinoxaline derivative TPQ (1,3,4-tris[(3-phenyl-6-trifluoromethyl)qunoxaline-2-yl]benzene), and triazole derivatives.

The photoactive layer may comprise an electron donor material and an electron acceptor material.

In one embodiment of the present disclosure, the electron donor material is the copolymer comprising the first unit of formula 1.

In one embodiment of the present disclosure, the electron acceptor material may be selected from the group consisting of fullerene, fullerene derivatives, vasocuproin, semiconductor elements, semiconductor compounds, or combinations thereof. Specifically, the electron acceptor material may be phenyl $C_{61}$-butyric acid methyl ester ($PC_{61}BM$) or phenyl $C_{71}$-butyric acid methyl ester ($PC_{71}BM$).

The electron donor material and the electron acceptor material in the photoactive layer can form a bulk heterojunction (BHJ). The electron donor material and the electron acceptor material may be mixed with each other at a ratio of 1:10-10:1 (w/w). After the electron donor material and the electron acceptor material have been mixed, they may be annealed at a temperature of 30 to 300° C. for 1 second to 24 hours in order to maximize the characteristics thereof.

The thickness of the photoactive layer may be 10-10,000 Å, but is not limited thereto.

In one embodiment of the present disclosure, a buffer layer may further be introduced between the photoactive layer and the first electrode, and an electron transfer layer, a hole blocking layer or an optical space layer may further be introduced between the photoactive layer and the second electrode.

As described in Korean Patent Laid-Open Publication No. 10-2010-0111767 which is incorporated herein by reference, in one preferred embodiment, the organic solar cell comprises the substrate, the first electrode, the photoactive layer and the second electrode. Herein, the photoactive layer comprises an electrode donor made of the copolymer, which comprises the first unit of formula 1, and an electron acceptor made of a C60 fullerene derivative or a C70 fullerene derivative.

In one embodiment of the present disclosure, the photovoltaic material of the photoactive layer comprises the copolymer comprising the first unit of formula 1, and the electron acceptor, which are mixed with each other at a weight ratio of 1:0.5-1:4.

In another embodiment of the present disclosure, the photovoltaic material of the photoactive layer comprises the copolymer comprising the first unit of formula 1, and a C60 fullerene derivative or a C70 fullerene derivative, which are mixed with each other at a weight ratio of 1:0.5-1:4.

If the fullerene derivative is used at a weight ratio of less than 0.5 relative to the copolymer comprising the first unit of formula 1, the mobility of electrons will be insufficient, because the content of the crystallized fullerene derivative will be insufficient, and if the fullerene derivative is used at a weight ratio of more than 4, the efficient absorption of light into the photoactive layer will not be achieved, because the amount of the copolymer comprising the first unit of formula 1 is relatively reduced.

In one embodiment of the present disclosure, the organic solar cell may either comprise an anode, a photoactive electrode and a cathode, which are arranged in that order, or comprise a cathode, a photoactive layer and an anode, which are arranged in that order, but the scope of the present invention is not limited thereto.

In another embodiment of the present disclosure, the organic solar cell may either comprise an anode, a hole transport layer, a photoactive layer, an electron transport layer and a cathode, which are arranged in that order, or comprise a cathode, an electron transport layer, a photoactive layer, a hole transport layer and an anode, which are arranged in that order, but the scope of the present invention is not limited thereto.

The organic solar cell of the present disclosure can be fabricated using the same materials and method as known in the art, except that the organic material layers comprise the copolymer comprising the first unit of formula 1, which is the compound of the present disclosure.

In another aspect, the present disclosure provides a method for fabricating an organic solar cell, the method comprising the steps of: preparing a substrate; forming a first electrode on a region of rear sides of the substrate; forming on the first layer an organic material layer comprising the copolymer including the first unit of formula 1; and forming a second electrode on the organic material layer.

The organic solar cell of the present invention can be fabricated, for example, by sequentially depositing the first electrode, the organic material layer and the second electrode on the substrate. Herein, the deposition can be performed using wet coating methods, including gravure printing, offset printing, screen printing, inkjet printing, spin coating, and spray coating, but is not limited thereto.

In the organic solar cell comprising the copolymer including the first unit of formula 1, the copolymer can serve as an electron donor.

Hereinafter, a method for preparing the first unit of formula 1, and a method for fabricating an organic solar cell using these units will be described in detail with reference to examples. It is to be understood, however, that these examples are for illustrative purposes only and are not intended to limit the scope of the present invention.

EXAMPLE 1

Synthesis of Monomers

Example 1-A

Preparation of N-9'-heptadecanyl-3,6-dibromocarbazole

Example 1-B

Preparation of 3,6-bis(4',4',5',5'-tetramethyl-1',3',2'-dioxaborolan-2'-yl)-N-9'-heptadecanylcarbazole In this Example, 9-heptadecane p-toluenesulfonate was prepared with reference to the literature (B. Nicolas, M. Alexandre, M. Leclerc, Adv. Mater. 19, 2295-2300).

3,6-Dibromo-9H-carbazole (4.00 g, 12.3 mmol) and potassium hydroxide (6.90 g, 123 mmol) were added to 30 ml of anhydrous dimethyl sulfoxide and stirred for 1 hour. Then, 9-heptadecane p-toluenesulfonate (7.58 g, 18.5 mmol) was added thereto and stirred for 12 hours.

The mixture was cooled to room temperature, extracted with hexane/ethyl acetate (3:1 v/v) and washed with water, after which the solution was dried with magnesium sulfate ($MgSO_4$) to remove water. The solvent was removed under reduced pressure, and the residue was purified by silica gel column chromatography to afford a white solid.

Yield: 86%

$^1$H NMR: (300 MHz, $CDCl_3$, ppm): δ 8.16 (br, 2H); 7.48 (br, 4H); 4.47 (br, 1H); 2.23 (br, 2H); 1.90 (br, 2H); 1.11 (br, 24H); 0.83 (t, J=7.1 Hz, 6H)

$^{13}$C NMR (75 MHz, $CDCl_3$, ppm): δ 129.39; 128.93; 123.73; 123.40; 113.42; 110.94; 57.23; 34.03; 32.13; 29.68; 29.66; 29.50; 27.02; 22.99; 14.47 m.p.: 53.6 to 55.7° C.

HRMS ($EI^+$, m/z) $[M]^+$ calculated for $C_{29}H_{41}Br_2N$, 561.1606. Found: 561.1608.

N-9'-Heptadecanyl-3,6-dibromocarbazole (4.00 g, 7.10 mmol) was added to and dissolved in 30 ml of anhydrous tetrahydrofuran) and cooled to −78° C., and 1.7 M n-butyllithium in hexane (17.5 ml, 29.8 mmol) was added thereto. The mixture was stirred for 1 hour, and then 2-isopropoxy-4, 4,5,5-tetramethyl-1,3,2-dioxaborolane (5.28 g, 28.4 mmol) was added at a time thereto. Then, the mixture was warmed to room temperature and stirred for 12 hours.

Water was added to the mixture to stop the reaction, and the mixture was extracted with diethyl ether and washed with water, after which the solution was dried with magnesium sulfate ($MgSO_4$) to remove water. The solvent was removed under reduced pressure, and the residue was purified by silica gel column chromatography to afford a white solid.

Yield: 57%

$^1$H NMR (300 MHz, $CDCl_3$, ppm): δ 8.68 (br, 2H); 7.87 (br, 2H); 7.56 (br, 1H); 7.39 (br, 1H); 4.58 (br, 1H); 2.29 (br, 2H); 1.90 (br, 2H); 1.39 (br, 24H); 1.13 (br, 24H); 0.81 (t, J=6.8 Hz, 6H)

$^{13}$C NMR (75 MHz, $CDCl_3$, ppm): δ 144.61; 141.20; 132.08; 128.40; 124.25; 122.85; 111.39; 108.66; 83.90; 56.94; 34.10; 32.14; 29.68; 27.10; 25.36; 22.99; 14.47 m.p.: 147.8 to 149.2° C.

HRMS ($EI^+$, m/z) $[M]^+$ calculated for $C_{29}H_{41}Br_2N$, 567.5100. Found: 567.5103.

In this Example, 4,7-bis-(5'-bromo-[2,2']bithiophen-5-yl)-5,6-bis-octyloxy-benzo-[1,2,5]thiadiazole) was prepared with reference to the literature (Y. Human, A. Solyman, I. Ahmed, W. C. Darren, K. James, L. G. David, J. Mater. Chem. 21, 13649-13656).

EXAMPLE 2

Synthesis of Copolymer 1

3,6-Bis(4',4',5',5'-tetramethyl-1',3',2'-dioxaborolan-2'-yl)-N-9'-heptadecanylcarbazole (3.3 mg, 0.005 mmol), 2,7-bis(4',4',5',5'-tetramethyl-1',3',2'-dioxaborolan-2'-yl)-N-9'-heptadecanylcarbazole (162 mg, 0.247 mmol), 4,7-bis-(5'-bromo-[2,2']bithiophen-5-yl)-5,6-bis-octyloxy-benzo-[1,2,5]thiadiazole (180 mg, 0.252 mmol), a 20% aqueous solution of tetraethylammonium hydroxide (3 ml), (tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.

Yield: 69%
Number-average molecular weight: 22,200 g/mol
Weight-average molecular weight: 57,900 g/mol

EXAMPLE 3

Synthesis of Copolymer 2

3,6-Bis(4',4',5',5'-tetramethyl-1',3',2'-dioxaborolan-2'-yl)-N-9'-heptadecanylcarbazole (9.9 mg, 0.015 mmol), 2,7-bis(4',4',5',5'-tetramethyl-1',3',2'-dioxaborolan-2'-yl)-N-9'-heptadecanylcarbazole (146 mg, 0.222 mmol), 4,7-bis-(5'- bromo-[2,2'|bithiophen-5-yl)-5,6-bis-octyloxy-benzo-[1,2,5]thiadiazole (180 mg, 0.252 mmol), a 20% aqueous solution of tetraethylammonium hydroxide (3 ml), tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.
Yield: 69%
Number-average molecular weight: 22,000 g/mol
Weight-average molecular weight: 41,500 g/mol

EXAMPLE 4

Synthesis of Copolymer 3

3,6-Bis(4',4',5',5'-tetramethyl-1',3',2'-dioxaborolan-2'-yl)-N-9'-heptadecanylcarbazole (16.5 mg, 0.025 mmol), 2,7-bis(4',4',5',5'-tetramethyl-1',3',2'-dioxaborolan-2'-yl)-N-9'-heptadecanylcarbazole (162 mg, 0.226 mmol), 4,7-bis-(5'-bromo-[2,2']bithiophen-5-yl)-5,6-bis-octyloxy-benzo-[1,2,5]thiadiazole (180 mg, 0.252 mmol), a 20% aqueous solution of tetraethylammonium hydroxide, tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.
Yield: 57%
Number-average molecular weight: 23,300 g/mol
Weight-average molecular weight: 43,800 g/mol

COMPARATIVE EXAMPLE 1

Synthesis of Copolymer 4

2,7-Bis(4',4',5',5'-tetramethyl-1',3',2'-dioxaborolan-2'-(166 mg, 0.252 mmol), 4,7-bis-(5'-bromo-[2,2']bithiophen-5-yl)-5,6-bis-octyloxy-benzo-[1,2,5]thiadiazole (180 mg, 0.252 mmol), a 20% aqueous solution of tetraethylammonium hydroxide, tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.
Yield: 57%
Number-average molecular weight: 21,000 g/mol
Weight-average molecular weight: 42,000 g/mol

COMPARATIVE EXAMPLE 2

Synthesis of Copolymer 5

3,6-Bis(4',4',5',5'-tetramethyl-1',3',2'-dioxaborolan-2'-yl)-N-9'-heptadecanylcarbazole (4.1 mg, 0.006 mmol), 2,7-bis (4',4',5',5'-tetramethyl-1',3',2'-dioxaborolan-2'-yl)-N-9'-heptadecanylcarbazole (201 mg, 0.306 mmol), 4,7-bis-(5-bromo-2-thienyl)-2,1,3-benzothiadiazole (143 mg, 0.312 mmol), a 20% aqueous solution of tetraethylammonium hydroxide solution (3 ml), tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.

Yield: 55%
Number-average molecular weight: 9,400 g/mol
Weight-average molecular weight: 33,300 g/mol

COMPARATIVE EXAMPLE 3

Synthesis of Copolymer 6

3,6-Bis(4',4',5',5'-tetramethyl-1',3',2'-dioxaborolan-2'-yl)-N-9'-heptadecanylcarbazole (20.5 mg, 0.030 mmol), 2,7-bis (4',4',5',5'-tetramethyl-1',3',2'-dioxaborolan-2'-yl)-N-9'-heptadecanylcarbazole (184 mg, 0.281 mmol), 4,7-bis-(5-bromo-2-thienyl)-2,1,3-benzothiadiazole (143 mg, 0.312 mmol), a 20% aqueous solution of tetraethylammonium hydroxide (3 ml), tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.

Yield: 58%
Number-average molecular weight: 11,100 g/mol
Weight-average molecular weight: 56,400 g/mol

COMPARATIVE EXAMPLE 4

Synthesis of Copolymer 7

3,6-Bis(4',4',5',5'-tetramethyl-1',3',2'-dioxaborolan-2'-yl)-N-9'-heptadecanylcarbazole (41.0 mg, 0.062 mmol), 2,7-bis (4',4',5',5'-tetramethyl-1',3',2'-dioxaborolan-2'-yl)-N-9'-heptadecanylcarbazole (164 mg, 0.250 mmol), 4,7-bis-(5-bromo-2-thienyl)-2,1,3-benzothiadiazole (143 mg, 0.312 mmol), a 20% aqueous solution of tetraethylammonium hydroxide solution (3 ml), tetrakis(triphenylphosphine)palladium (0) (5 mg) and Aliquat 336 were added to 3 ml of toluene and stirred under reflux. After 72 hours, phenylboronic acid (0.05 g) was added to and reacted with the reaction mixture for 3 hours, after which bromobenzene (0.12 g) was added to and reacted with the mixture for 4 hours. Then, the mixture was cooled to room temperature and poured into methanol. The solid was filtered and Soxhlet-extracted with acetone, hexane and chloroform. The extract was precipitated in methanol, and the solid was filtered.

Yield: 60%
Number-average molecular weight: 10,700 g/mol
Weight-average molecular weight: 20,500 g/mol Fabricate of Organic Solar Cells and Measurement of Properties Thereof.

Each of the above-prepared copolymers and $PC_{71}BM$ ([6,6]-phenyl $C_{61}$ butyric acid methyl ester were dissolved in 1,2-dichlorobenzene (DCB) to prepare composite solutions. Herein, the concentration of the copolymer in the composite solution was adjusted to 1-2 wt %. In order to fabricate organic solar cells having a structure of ITO/PEDOT:PSS/photoactive layer/LiF/Al, a glass substrate coated with ITO was ultrasonically washed with distilled water, acetone and 2-propanol, and the surface of the ITO was treated with ozone for 10 minutes, and then spin-coated with PEDOT:PSS (AI 4083) to a thickness of 25 nm, followed by heat treatment at 235° C. for 10 minutes. For coating of the photoactive layer, each of the polymer-$PC_{71}BM$ composite solutions was filtered with a 0.45-μm PP syringe filter and spin-coated on the PEDOT:PSS layer, followed by heat treatment at 120° C. for 5 minutes. Then, LiF was deposited on the photoactive layer to a thickness of 6 Å under a vacuum of $3\times10^{-8}$ torr using a thermal evaporator, after which Al was deposited on the LiF to a thickness of 120 nm. The photovoltaic properties of the organic solar cells fabricated as described above were measured under a condition of 100 $mW/cm^2$ (AM 1.5), and the results of the measurement are shown in Table 1 below.

TABLE 1

| | Properties of organic solar cells | | | | |
|---|---|---|---|---|---|
| | Co-polymer | Molar ratio (%) of 3,6-carbazole | short circuit current density (mA/cm2) | open circuit voltage (V) | Fill factor | power conversion efficiency (%) |
| Example 2 | Co-polymer 1 | 1 | 11.8 | 0.88 | 40.5 | 4.2 |

TABLE 1-continued

Properties of organic solar cells

| | Co-polymer | Molar ratio (%) of 3,6-carbazole | short circuit current density (mA/cm2) | open circuit voltage (V) | Fill factor | power conversion efficiency (%) |
|---|---|---|---|---|---|---|
| Example 3 | Co-polymer 2 | 3 | 10.9 | 0.82 | 39.5 | 3.5 |
| Example 4 | Co-polymer 3 | 5 | 9.5 | 0.76 | 41.7 | 3.0 |
| Comparative Example 1 | Co-polymer 4 | 0 | 10.8 | 0.87 | 39.0 | 3.7 |

Measurement of Solubilities of Copolymers

Each of the above-prepared copolymers was added to 1 ml of 1,2-dichlorobenzene (DCB) while the amount of copolymer added was increased at an increment of 5 mg up to 10-200 mg. Each of the copolymers added was dissolved with stirring, and the transmittance of each of the solutions was measured using a UV-Vis spectrometer. The solubility of each of the copolymers was defined as the amount of the corresponding copolymer at which the transmittance of the solution of the corresponding copolymer in 1,2-dichlorobenzene (DCB) was reduced to 90% or less of the transmittance of the solution of the corresponding copolymer dissolved in DCB at a concentration of 10 mg/ml. The results of measurement of the solubility of each copolymer are shown in Table 2 below.

TABLE 2

Results of solubilities of copolymers

| | Copolymer | Solubility (mg/ml) |
|---|---|---|
| Example 2 | Copolymer 1 | 160 mg/ml |
| Example 3 | Copolymer 2 | 155 mg/ml |
| Example 4 | Copolymer 3 | 140 mg/ml |
| Comparative Example 2 | Copolymer 5 | 25 mg/ml |
| Comparative Example 3 | Copolymer 6 | 20 mg/ml |
| Comparative Example 4 | Copolymer 7 | 20 mg/ml |

As can be seen in Table 2 above, when a substituent which increases solubility is introduced into the side chain of the copolymer comprising the unit of formula 1, the solubility of the copolymer is increased.

According to the present disclosure, when an alkyl, alkoxy, hydroxyl or sulfide group is introduced into the above-described copolymer, the solubility of the copolymer can be increased.

When a copolymer having increased solubility is used, it can be highly miscible with an electron acceptor, so that the contact interface with the electron acceptor can be increased. In addition, the time required for dissolving the copolymer can be reduced and an organic layer film formed using the copolymer can become uniform.

As described above, the copolymer according to the present disclosure can be used as a material for the organic material layer of an organic solar cell, and an organic solar cell comprising the same can exhibit excellent properties, including increased open voltage and increased efficiency.

In particular, the novel copolymer according to the present disclosure shows high solubility in an organic solvent, has a deep HOMO level and high charge mobility, and thus can exhibit excellent properties. Furthermore, the copolymer according to the present invention may be used in a pure or impure form in an organic solar cell and may be applied using a solution application method. In addition, the copolymer of the present disclosure can increase the optical efficiency of the organic solar cell and improve the cycle life characteristics of the organic solar cell thanks to its thermal stability.

What is claimed is:

1. A copolymer comprising a first unit represented by the formula 1 and at least two units different from the first unit,
wherein the two units different from the first unit include at least one electron acceptor and at least one electron donor,
the electron donor is represented by the following formula 4,
the first unit is present in an amount of greater than 0 mole % and 45 mole % or less based on the total moles of monomers constituting the copolymer, and
the electron acceptor is substituted with a substituted or unsubstituted alkoxy group having 1 to 40 carbon atoms:

[Formula 1]

wherein
o and p are each an integer ranging from 0 to 3;
$R_a$ and $R_b$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_a$ and $R_b$ may form a condensed ring; and
$R_1$ is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, and

[Formula 4]

wherein q and r are each an integer ranging from 0 to 3;

$R_6$ and $R_7$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_6$ and $R_7$ may form a condensed ring; and R″ is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S.

2. The copolymer of claim 1, wherein the electron acceptor is present in an amount of greater than 0 mole % and 50 mole % or less based on the total moles of the monomers.

3. The copolymer of claim 1, wherein the unit different from the first unit includes at least two electron acceptors and at least one electron donor.

4. The copolymer of claim 1, wherein the copolymer comprises one represented by the following formula 2:

[Formula 2]

wherein l is a mole fraction in the range of 0<l<1;

m is a mole fraction in the range of 0<m<1;

l+m=1;

n is an integer ranging from 1 to 10,000;

A is represented by the above formula 1;

B, C and D are the same or different and are each independently an electron acceptor or an electron donor;

at least one of B, C, and D is represented by the formula 4; and at least one of B, C and D is an electron acceptor.

5. The copolymer of claim 1, wherein the electron acceptor is represented by the following formula 3:

[Formula 3]

wherein s and t are each an integer ranging from 0 to 4;

$R_8$ to $R_{13}$ are the same or different and are each independently selected from the group consisting of hydrogen, a hydroxyl group, a substituted or unsubstituted alkyl group having 1 to 40 carbon atoms, a substituted or unsubstituted alkoxy group having 1 to 40 carbon atoms, and a substituted or unsubstituted sulfide group having 1 to 40 carbon atoms, or adjacent two of $R_8$ to $R_{13}$ may form a condensed ring; and at least one of $R_8$ to $R_{13}$ is a substituted or unsubstituted alkyl group having 1 to 40 carbon atoms.

6. The copolymer of claim 5, wherein at least two of $R_8$ to $R_{13}$ are a substituted or unsubstituted alkoxy group having 1 to 40 carbon atoms.

7. The copolymer of claim 5, wherein $R_{10}$ and $R_{11}$ are the same or different and are each independently a substituted or unsubstituted alkoxy group having 1 to 40 carbon atoms.

8. A copolymer comprising a first unit represented by the following formula 1, a second unit represented by the following formula 3 and a third unit represented by the following formula 4:

[Formula 1]

[Formula 3]

[Formula 4]

wherein o, p, q and r are each an integer ranging from 0 to 3;

s and t are each an integer ranging from 0 to 4;

$R_1$ and R" are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S;

$R_a$, $R_b$, $R_6$ and $R_7$ are the same or different and are each independently selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S, or adjacent two of $R_a$, $R_b$, $R_6$ and $R_7$ may form a condensed ring;

$R_8$ to $R_{13}$ are the same or different and are each independently selected from the group consisting of hydrogen, a hydroxyl group, a substituted or unsubstituted alkyl group having 1 to 40 carbon atoms, a substituted or unsubstituted alkoxy group having 1 to 40 carbon atoms, and a substituted or unsubstituted sulfide group having 1 to 40 carbon atoms, or adjacent two of $R_8$ to $R_{13}$ may form a condensed ring; and at least one of $R_8$ to $R_{13}$ is a substituted or unsubstituted alkoxy group having 1 to 40 carbon atoms.

9. The copolymer of claim 8, wherein the first unit is present in an amount of greater than 0 mole % and 10 mole % or less based on the total moles of monomers constituting the copolymer, the second unit is present in an amount of greater than 0 mole % and 50 mole % or less based on the total moles of the monomers, and the third unit is present in an amount of more than 0 mole % and 40 mole % or less.

10. The copolymer of claim 1, wherein the copolymer further comprises a fourth unit represented by the following formula 5 and a fifth unit represented by the following formula 6:

[Formula 5]

[Formula 6]

wherein $R_1$ is as defiend in formula 1;

l is a mole fraction in the range of $0<l\leq1$;

m is a mole fraction in the range of $0\leq m<1$;

l+m=1;

R" is selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, and a substituted or unsubstituted heterocyclic group containing at least one heteroatom selected from among N, O and S; and $R_{10}$ and $R_{11}$ are the same or different and are each independently a substituted or unsubstituted alkoxy group having 1 to 40 carbon atoms.

11. The copolymer of claim 1, wherein the copolymer has a solubility of 100 mg/ml in a 1,2-dichlorobenzene (DCB) solvent.

12. The copolymer of claim 1, wherein the copolymer has an aryl group as its end group.

13. The copolymer of claim 1, wherein the copolymer is a heterocyclic group as its end group.

14. The copolymer of claim 1, wherein the copolymer has a number-average molecular weight of 500-1,000,000 g/mol.

15. The copolymer of claim 1, wherein the copolymer has a molecular weight distribution of 1-100.

16. An organic solar cell comprising: a first electrode; a second electrode opposite the first electrode; and one or more organic material layers interposed between the first electrode and the second electrode and including a photoactive layer, wherein one or more of the organic material layers comprise the copolymer claim 1.

17. The organic solar cell of claim 16, wherein the organic material layers comprise one or more selected from the consisting of an electron donor and an electron acceptor, wherein the electron donor is the copolymer.

18. The organic solar cell of claim 17, wherein the electron acceptor is selected from the group consisting of fullerene, fullerene derivatives, carbon nanotubes, carbon nanotube derivatives, vasocuproin, semiconductor elements, semiconductor compounds, and combinations thereof.

19. The organic solar cell of claim 17, wherein the electron acceptor is a C60 fullerene derivative or a C70 fullerene derivative.

20. The organic solar cell of claim 17, wherein the copolymer and the electron acceptor are mixed with each other at a weight ratio of 1:0.5-1:4.

21. The organic solar cell of claim 19, wherein the polymer and the C60 fullerene derivative or the C70 fullerene derivative are mixed with each other at a weight ratio of 1:0.5-1:4.

22. A method for fabricating an organic solar cell, the method comprising the steps of:
preparing a substrate;
forming a first electrode on a region of rear sides of the substrate;
forming on the first electrode an organic material layer comprising the copolymer of claim 1; and
forming a second electrode on the organic material layer.

* * * * *